(12) United States Patent
Liu et al.

(10) Patent No.: US 6,372,621 B1
(45) Date of Patent: Apr. 16, 2002

(54) METHOD OF FORMING A BONDING PAD ON A SEMICONDUCTOR CHIP

(75) Inventors: Hermen Liu, Taoyuan; Yimin Huang, Tai-Chung Hsien, both of (TW)

(73) Assignee: United Microelectronics Corp., Hsin-Chu (TW)

( * ) Notice: Subject to any disclaimer, the term of this patent is extended or adjusted under 35 U.S.C. 154(b) by 0 days.

(21) Appl. No.: 09/293,963

(22) Filed: Apr. 19, 1999

(51) Int. Cl.[7] .............................................. H01L 21/44
(52) U.S. Cl. ........................................ 438/612; 438/613
(58) Field of Search ................................. 438/612, 613, 438/614, FOR 343

(56) References Cited

U.S. PATENT DOCUMENTS 4,723,197 A * 2/1988 Takiar et al.
5,751,065 A * 5/1998 Chittipeddi et al.
6,143,638 A * 11/2000 Bohr

FOREIGN PATENT DOCUMENTS

JP              357023247       * 2/1982

* cited by examiner

*Primary Examiner*—George Fourson
*Assistant Examiner*—Thanh V Pham
(74) *Attorney, Agent, or Firm*—Winston Hsu

(57) ABSTRACT

The present invention provides a method of forming a bonding pad on a semiconductor chip such that peeling of bonding pads during interconnection in the packaging process is avoided. The bonding pad is used to electrically connect an integrated circuit in the semiconductor chip with an external circuit. The method comprises forming a first dielectric layer at a predetermined area on the surface of the semiconductor chip, forming a second dielectric layer on the surface of the semiconductor chip outside the predetermined area wherein the first dielectric layer is harder than the second dielectric layer, and forming the bonding pad on the first dielectric layer.

7 Claims, 3 Drawing Sheets

METHOD OF FORMING A BONDING PAD ON A SEMICONDUCTOR CHIP

BACKGROUND OF THE INVENTION

1. Field of the Invention

The present invention relates to a semiconductor chip, and more particularly, to a method of forming a bonding pad on a semiconductor chip.

2. Description of the Prior Art

In a semiconductor process, when MOS transistors are formed on a semiconductor chip, the MOS transistors are connected by using multiple metallic interconnects. Contact of the metallic interconnects and the MOS transistors is avoided by depositing dielectric layers with a lower dielectric constant. This also reduces induced capacitance between them thus increasing the speed of signal transmission. When forming the last layer of metallic interconnects, a bonding pad will be formed in a predetermined area on the last dielectric layer as an interconnection area in a follow-up packaging process.

Please refer to FIG. 1. FIG. 1 is a perspective view of the structure of a bonding pad 14 of a prior art semiconductor wafer 10. After forming the last dielectric layer 12 on the semiconductor wafer 10, the last layer of metallic interconnects is formed, and a metallic layer is formed as the bonding pad 14 in a predetermined area on the dielectric layer 12. After an error-free electrical test is performed, the semiconductor wafer 10 is then sectioned into individual chips for performing a following packaging process. If the dielectric constant of the dielectric layer 12 is too high, the speed of signal transmission between the dielectric layers 12 will be reduced. Therefore, the dielectric layer 12 is made of fluoride silicate glass (FSG) in the prior art with a low dielectric constant.

Please refer to FIG. 2. FIG. 2 is a perspective view of the bonding pad 14 on a chip 15 connected to a metallic wire 18. When performing a wire bonding process, one side of the chip 15 is first fixed onto a baseplate 16 and one end of the metallic wire 18 is heated to form a metallic ball 17. This allows bonding of the metallic wire 18 to the bonding pad 14. Next, the other end of the metallic wire 18 is dragged to and linked to a predetermined area of the baseplate 16 so that electronic signals of the chip 15 can be transmitted to external components. The dielectric layer 12 below the bonding pad 14 is made of flouride silicate glass (FSG) with a lower degree of hardness. Therefore, when the metallic wire 18 is dragged across the surface of the baseplate 16, or when the chip 15 is washed by performing a supersonic vibration process, the metallic ball 17, bonding pad 14 and part of the dielectric layer 12 are peeled off from the surface of the chip 15. This causes damage to the chip 15 and reduces reliability of packaging.

SUMMARY OF THE INVENTION

It is therefore a primary objective of the present invention to provide a method of forming a bonding pad on a semiconductor chip to solve the above mentioned problem.

In a preferred embodiment, the present invention provides a method of forming a bonding pad on a semiconductor chip, the bonding pad being used to electrically connect an integrated circuit in the semiconductor chip with an external circuit, the method comprising:

forming a first dielectric layer at a predetermined area on the surface of the semiconductor chip;

forming a second dielectric layer on the surface of the semiconductor chip outside the predetermined area wherein the first dielectric layer is harder than the second dielectric layer; and forming the bonding pad on the first dielectric layer.

It is an advantage of the present invention that by using a harder first dielectric layer, the bonding pad can be firmly bonded to the surface of the semiconductor chip without peeling. Since the dielectric constant of the second dielectric layer is lower in the present invention, signal transmission speeds are not affected.

This and other objectives of the present invention will no doubt become obvious to those of ordinary skill in the art after having read the following detailed description of the preferred embodiment which is illustrated in the various figures and drawings.

DETAILED DESCRIPTION OF THE PREFERRED EMBODIMENT

Figure 1:
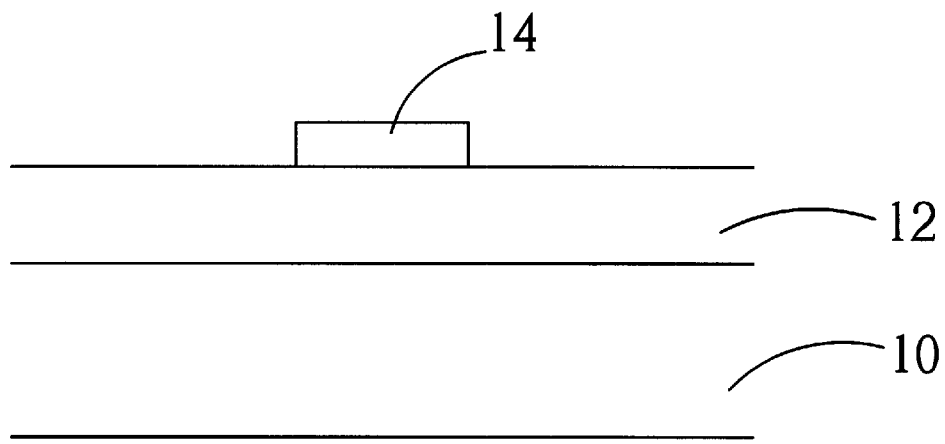
FIG. 1 is a perspective view of the structure of a bonding pad of a prior art semiconductor wafer.
Figure 2:
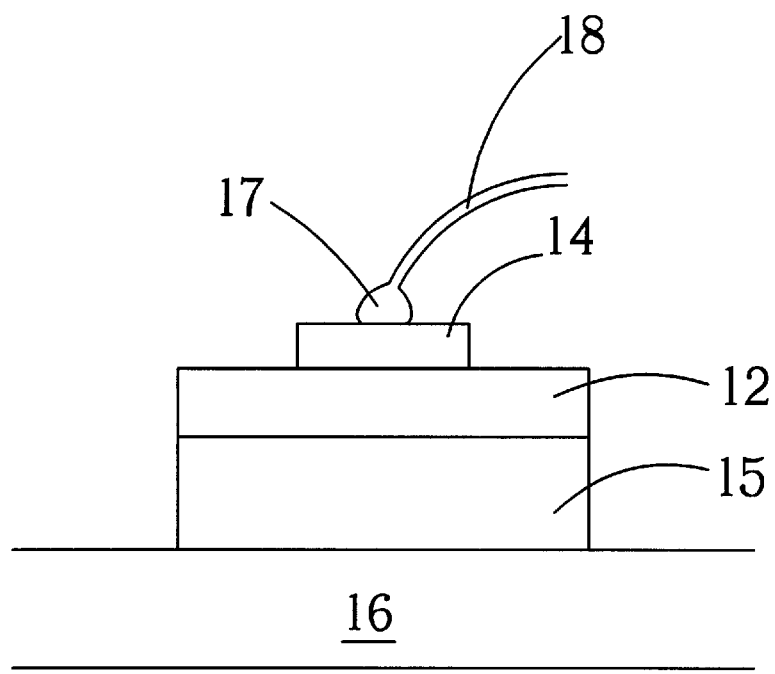
FIG. 2 is a perspective view of the bonding pad in FIG. 1 on a chip connected to a metallic wire.
Figure 3:
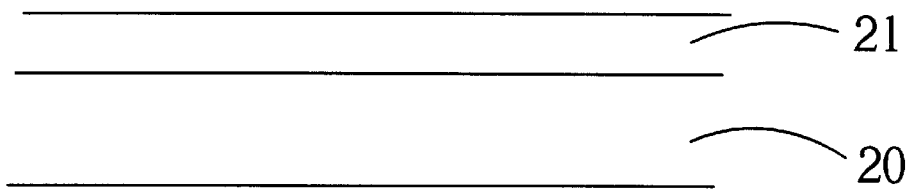
FIG. 3 to FIG. 7 are perspective views of forming a bonding pad on a semiconductor wafer according to the present invention.
Figure 4:
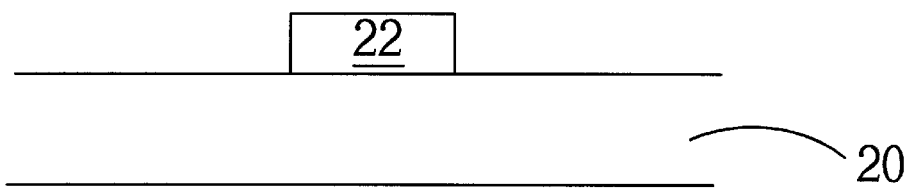

Please refer to FIG. 3 to FIG. 7. FIG. 3 to FIG. 7 are perspective views of forming a bonding pad 26 on a semiconductor wafer 20 according to the present invention. The bonding pad 26 is used for electrically connecting integrated circuits on the semiconductor wafer 20 with external circuits. In FIG. 3, a uniform silicon dioxide ($SiO_2$) layer 21 is formed on the semiconductor wafer 20, and photolithographic and etching processes are then performed to remove the silicon dioxide layer 21 outside of a predetermined area. This forms a first dielectric layer 22 as shown in FIG. 4.

Figure 5:
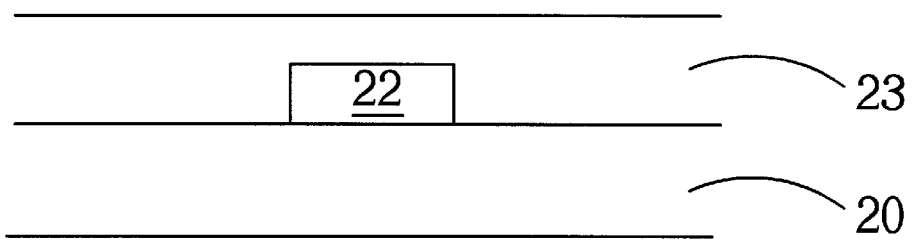
Figure 6:
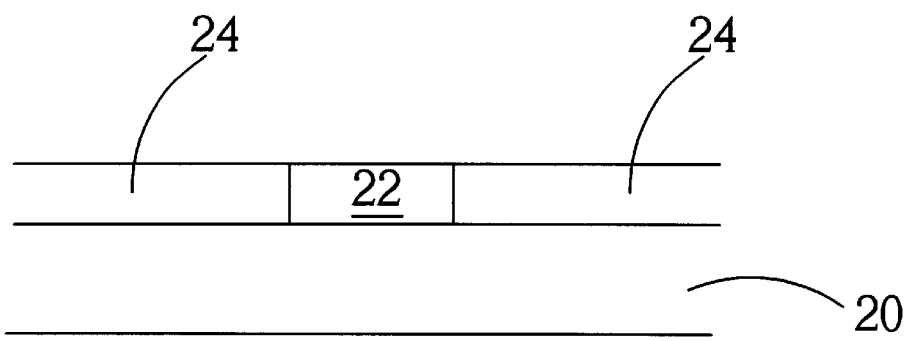

Then, a flouride silicate glass (FSG) layer 23 is uniformly deposited on the semiconductor wafer 20 as shown in FIG. 5 followed by performing a chemical mechanical polishing (CMP) process to remove all the flouride silicate glass (FSG) in the predetermined area on the first dielectric layer 22. A second dielectric layer 24 is thus formed in close approximation to the sides of the first dielectric layer 22 as shown in FIG. 6. The dielectric constant and the degree of the hardness of the first dielectric layer 22 are both greater than those of the second dielectric layer 24.

Figure 7:
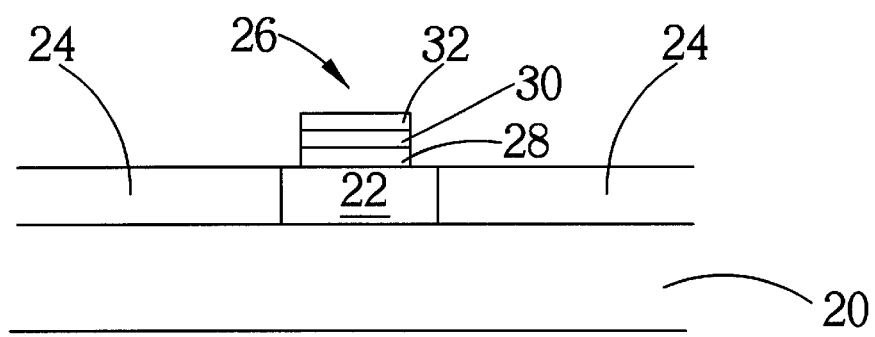

The bonding pad 26 is formed on the first dielectric layer 22 at the same time the last layer of metal interconnects of the second dielectric layer 24 is prepared. As shown in FIG. 7, the bonding pad 26 comprises a titanium (Ti) glue layer 28 as its bottom layer, an aluminum alloy layer 30 on top of the glue layer 28, and a titanium nitride (TiN) anti-reflection layer 32 on top of the aluminum alloy layer 30. The aluminum alloy layer 30 is formed of aluminum and copper with more than 95% aluminum by weight. The aluminum alloy layer 30 can be made of aluminum (Al), copper (Cu) or alloy of aluminum.

In summary, the semiconductor wafer 20 formed by the method of the present invention comprises a first dielectric layer 22 in a predetermined area on the semiconductor wafer 20, a second dielectric layer 24 outside the predetermined area of the surface of the wafer 20 and a bonding pad 26 formed on the first dielectric layer 22 (FIG. 7). The first dielectric layer 22 is formed of silicon dioxide, the second dielectric layer 24 is formed of flouride silicate glass (FSG). The first dielectric layer 22 is harder and more durable than the dielectric layer 12 under the bonding pad 14 of the prior art. As such, the present invention dielectric layer 22 can withstand the stress exerted when connecting the metallic wire 18 with external circuits. This prevents peeling off of the bonding pad 26 from the dielectric layer 22.

Figure 8:
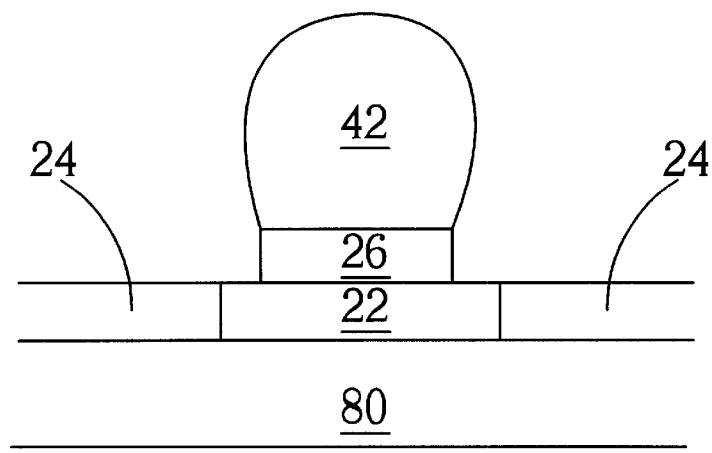
FIG. 8 and FIG. 9 are perspective views of packaging a chip cut from the wafer in FIG. 3.
Figure 9:
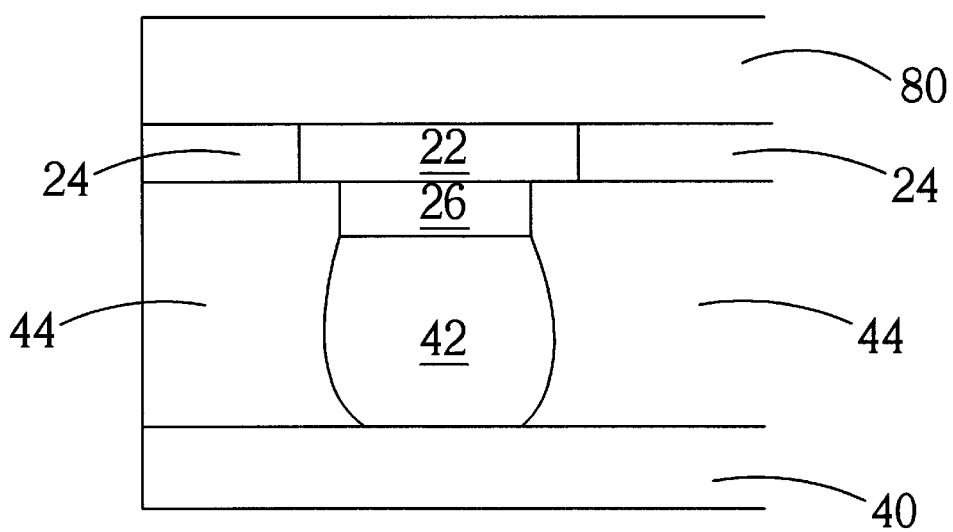

Please refer to FIG. 8 and FIG. 9. FIG. 8 and FIG. 9 are perspective views of packaging a chip 80 cut from the wafer 20. The manufacturing method for the bonding pad may also be used in "flip chip" processing. In this scheme, the chip 80 is cut from the semiconductor wafer 20. In the first step, a metallic lump 42 is formed on the bonding pad 26 of the chip 80 as shown in FIG. 8. Then, the chip 80 is turned upside-down so that the melted metallic bump 42 contacts a baseplate 40. The chip 80 is then fixed to the baseplate 40 by solidifying the metallic lump 42. Next, liquid epoxy 44 is injected into the gap between the chip 80 and the baseplate 40 followed by solidifying the epoxy 44 by baking, as shown in FIG. 9. Internal stress occurs during baking of the epoxy 44 due to differences of the expansion coefficients of the chip 80, epoxy 44 and baseplate 40. Depite this, the bonding pad 26 can withstand the stress due to the increased hardness of the first dielectric layer 22. Therefore, peeling or rupture of the interface between the bonding pad 26 and the first dielectric layer 22 is prevented.

In contrast to the prior art process of forming the bonding pad, the first dielectric layer under the bonding pad in present invention has increased hardness. The second dielectric layer, formed in areas not occupied by the first dielectric layer, has a lower dielectric constant. With the increased hardness of the first dielectric layer, the bonding pad can be more firmly bonded to the surface of the semiconductor chip and peeling can be prevented. Furthermore, the speed of signal transmission is not affected because the dielectric constant of the second dielectric layer is low.

Those skilled in the art will readily observe that numerous modifications and alterations of the device may be made while retaining the teaching of the invention. Accordingly, the above disclosure should be construed as limited only by the metes and bounds of the appended claims.

What is claimed is:

1. A method of forming a bonding pad on a semiconductor chip, the bonding pad being used to electrically connect an integrated circuit in the semiconductor chip with an external circuit, the method comprising:

forming a uniform dielectric layer by using a first dielectric material on the surface of the semiconductor chip;

performing photolithographic and etching processes to remove the first dielectric material outside of a predetermined area to form a first dielectric layer;

forming a uniform dielectric layer by using a second dielectric material on the surface of the semiconductor chip and the first dielectric layer wherein the first dielectric material is harder than the second dielectric material;

removing the second dielectric material positioned on the surface of the first dielectric layer to form a second dielectric layer wherein the surface of the second dielectric layer is coplanar with the surface of the first dielectric layer and adjacent to the first dielectric layer; and forming the bonding pad on the first dielectric layer.

2. The method of claim 1 wherein the second dielectric material is removed from the surface of the first dielectric layer by performing a chemical mechanical polishing process.

3. The method of claim 1 wherein the dielectric constant of the first dielectric layer is greater than that of the second dielectric layer.

4. The method of claim 1 wherein the first dielectric layer is formed of silicon dioxide ($SiO_2$), and the second dielectric layer is formed of flouride silicate glass (FSG).

5. The method of claim 1 wherein the bonding pad is a metallic layer formed of aluminum (Al), copper (Cu) or alloy of aluminum.

6. The method of claim 3 wherein the alloy is formed of aluminum and copper with more than 95% of aluminum by weight.

7. The method of claim 1 wherein the bonding pad comprises a glue layer formed of titanium (Ti) positioned on the surface of the first dielectric layer, an aluminum alloy layer positioned on the glue layer, and an anti-reflection layer formed of titanium nitride (TiN) positioned on the aluminum alloy layer.

* * * * *